United States Patent
Kim (10) Patent No.: US 9,698,362 B2
(45) Date of Patent: Jul. 4, 2017

(54) ROLLABLE ORGANIC LIGHT EMITTING DISPLAY SYSTEM

(71) Applicant: LG DISPLAY CO., LTD., Seoul (KR)

(72) Inventor: Han Il Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 60 days.

(21) Appl. No.: 14/840,803

(22) Filed: Aug. 31, 2015

(65) Prior Publication Data
US 2016/0155966 A1 Jun. 2, 2016

(30) Foreign Application Priority Data
Dec. 1, 2014 (KR) .................. 10-2014-0169745

(51) Int. Cl.
*H01L 51/00* (2006.01)
*H01L 51/52* (2006.01)

(52) U.S. Cl.
CPC ...... *H01L 51/0097* (2013.01); *H01L 51/5246* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 7,816,676 B2* | 10/2010 | Fourst | .................. | H01L 51/524 257/100 |
| 8,929,085 B2* | 1/2015 | Franklin | ............... | G06F 1/1626 361/749 |
| 2005/0184662 A1 | 8/2005 | Cok et al. | | |
| 2005/0224935 A1* | 10/2005 | Schaepkens | ........ | H01L 51/0097 257/678 |
| 2006/0226523 A1* | 10/2006 | Foust | .................. | H01L 51/0097 257/680 |
| 2006/0278965 A1* | 12/2006 | Foust | .................... | H01L 51/524 257/678 |
| 2008/0185701 A1* | 8/2008 | Foust | .................... | H01L 51/524 257/682 |
| 2010/0096633 A1 | 4/2010 | Hatano et al. | | |
| 2010/0167002 A1 | 7/2010 | Chu et al. | | |
| 2013/0083496 A1* | 4/2013 | Franklin | ............... | G06F 1/1626 361/749 |
| 2014/0166992 A1* | 6/2014 | Hack | .................... | H01L 51/5253 257/40 |

\* cited by examiner

*Primary Examiner* — Lex Malsawma
(74) *Attorney, Agent, or Firm* — Dentons US LLP (57) ABSTRACT

Disclosed is a rollable organic light emitting display system capable of protecting an organic light emitting display device from an external impact. The rollable organic light emitting display system has an organic light emitting diode layer between two substrates, wherein the two substrates are capable of being rolled or unrolled, includes a protection film covering a lateral surface of at least one of the substrates so as to prevent the lateral surface of the at least one substrate from being damaged by an external impact when the two substrates are unrolled and the lateral surface of the two substrates is exposed to the external.

16 Claims, 4 Drawing Sheets

ROLLABLE ORGANIC LIGHT EMITTING DISPLAY SYSTEM

CROSS REFERENCE TO RELATED APPLICATIONS

This application claims the benefit of the Korean Patent Application No. 10-2014-0169745 filed on Dec. 1, 2014, which is hereby incorporated by reference in its entirety as if fully set forth herein.

BACKGROUND OF THE INVENTION

Field of the Disclosure

Embodiments of the present invention relate to an organic light emitting display device, and more particularly, to a rollable organic light emitting display system.

Discussion of the Related Art

An organic light emitting display device (OLED) is a self light emitting display device. The organic light emitting display device may be fabricated to be lightweight and have a slim size as it does not need a separate light source unlike a liquid crystal display device (LCD). Also, the organic light emitting display device is favorable in view of power consumption due to low voltage driving and also is excellent for color gamut, a response speed, a viewing angle, and a contrast ratio (CR).

Recently, a flexible display device, which may display an image while being bent by the use of a flexible material such as plastic or metal foil instead of an inflexible material such as a glass substrate, has been manufactured. Furthermore, a rollable display device, which may be rolled, has been manufactured.

Figure 1A:
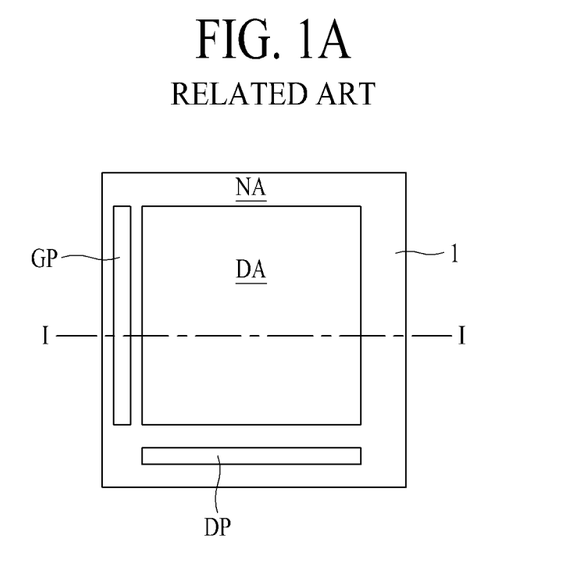
FIG. 1A is a plane view illustrating a related art organic light emitting display device.

FIG. 1A is a plane view illustrating a related art organic light emitting display device.

Figure 1B:
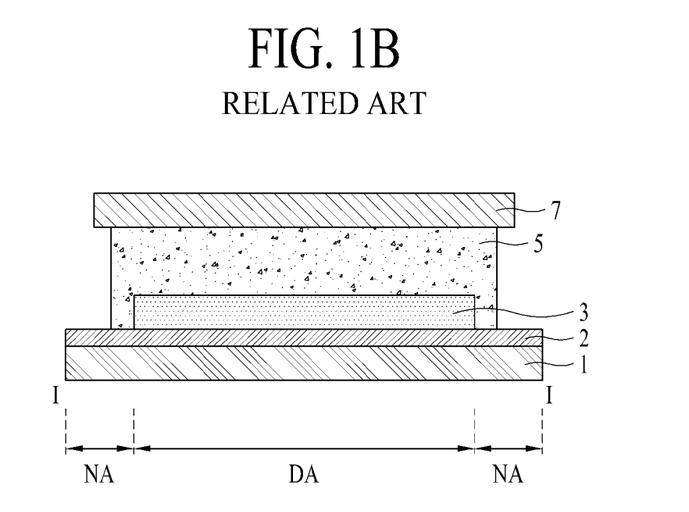
FIG. 1B is a cross sectional view illustrating the related art organic light emitting display device, which is a cross sectional view along I-I of FIG. 1A.

As shown in FIG. 1A, a display area (DA) is disposed on a substrate 1 of the related art organic light emitting display device, and a non-display area (NA) is disposed in the periphery of the display area (DA). Herein, a gate pad (GP) and a data pad (DP) are provided in the non-display area (NA). For example, the gate pad (GP) is disposed at a left side of the display area (DA), and the data pad (DP) is disposed at a lower side of the display area (DA). FIG. 1B is a cross sectional view illustrating the related art organic light emitting display device, and FIG. 1B is a cross sectional view along I-I of FIG. 1A.

As shown in FIG. 1B, the related art organic light emitting display device may include the substrate 1, a thin film transistor layer 2, an organic light emitting diode layer 3, an encapsulation layer 5 and an encapsulation substrate 7.

In the display area (DA) of the substrate 1, there are the thin film transistor layer 2, the organic light emitting diode layer 3, the encapsulation layer 5 and the encapsulation substrate 7 which are sequentially stacked thereon.

The thin film transistor layer 2 is formed on the substrate 1. Although not shown, the thin film transistor layer 2 may include a switching thin film transistor and a driving thin film transistor which are provided by each pixel.

The thin film transistor layer 2, the encapsulation layer 5 and the encapsulation substrate 7 extend to the non-display area (NA) of the substrate 1. The thin film transistor layer 2 includes the gate pad (GP) formed in the non-display area (NA) of the substrate 1, wherein the gate pad (GP) is connected with an external circuit driver such as a flexible printed circuit film. The gate pad (GP) is prepared in the non-display area (NA) of the substrate 1, whereby a length of the substrate 1 is greater than a length of the encapsulation substrate 7.

The organic light emitting diode layer 3 is formed on the thin film transistor layer 2. Although not shown, the organic light emitting diode layer 3 may include a cathode, an anode and an emitting layer provided between the cathode and the anode.

The encapsulation layer 5 is formed on the organic light emitting diode layer 3. The encapsulation layer 5 is disposed to cover the organic light emitting diode layer 3, and is provided to reduce a permeation of moisture into the inside of the organic light emitting diode layer 3.

The encapsulation substrate 7 is formed on the encapsulation layer 5. The encapsulation substrate 7 together with the encapsulation layer 5 protects the organic light emitting diode layer 3 from moisture and oxygen provided from the external.

The related art organic light emitting display device has the following disadvantages.

Structurally, the related art organic light emitting display device is weak to an external impact. Thus, the related art organic light emitting display device may be easily damaged by an external impact. In more detail, if an external impact is applied from a direction of a lower surface of the substrate 1 or a direction of an upper surface of the encapsulation substrate 7, the substrate 1 and the encapsulation substrate 7 may absorb the external impact somewhat, whereby there may be no significant problems. However, an additional impact-absorbing element is not provided at a lateral side of the substrate 1. Thus, if the external force is applied from a lateral direction of the substrate 1, the lateral side of the substrate 1 may be easily damaged. Especially, the length of the substrate 1 is greater than the length of the encapsulation substrate 7, that is, the substrate 1 protrudes more than the encapsulation substrate 7. In comparison to the encapsulation substrate 7, if the external impact is applied to the substrate 1, there is a high possibility of a damage on the lateral side of the substrate 1. Also, the substrate 1 is formed of glass which endures a high-temperature deposition process for formation of the thin film transistor layer 2. Meanwhile, in case of the encapsulation substrate 7, there is less need for enduring a high temperature because the encapsulation substrate 7 is formed on the organic light emitting diode layer 3 after forming the thin film transistor layer 2 and the organic light emitting diode layer 3 on the substrate 1. Thus, the encapsulation substrate 7 may be formed of a plastic material or a metal material in a bottom emission method. If the external impact is applied, the substrate 1 of the glass material may be damaged in comparison to the encapsulation substrate 7 of the plastic or metal material.

Also, in case of the rollable organic light emitting display device, it is difficult to prepare an additional protection case since a roll-in operation and a roll-out operation are repetitively carried out. Accordingly, in case of the rollable organic light emitting display device, the lateral side of the substrate 1 is exposed to the external without any protection element, whereby the substrate 1 may be damaged by the externally-applied physical impact.

SUMMARY OF THE INVENTION

Accordingly, embodiments of the present invention are directed to a rollable organic light emitting display system that substantially obviates one or more problems due to limitations and disadvantages of the related art.

An aspect of embodiments of the present invention is directed to provide an organic light emitting display device which is capable of protecting a lateral side of a substrate from an external impact, and a rollable organic light emitting display system using the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a rollable organic light emitting display system with an organic light emitting diode layer between two substrates, wherein the two substrates are capable of being rolled or unrolled, the system comprising a protection film covering a lateral surface of at least one of the substrates so as to prevent the lateral surface of the at least one substrate from being damaged by an external impact when the two substrates are unrolled and the lateral surface of the two substrates is exposed to external impact.

In the rollable organic light emitting display system according to an embodiment of the present invention, the protection film covers front and lateral surfaces of any one of the substrates having the organic light emitting diode layer of the two substrates.

In the rollable organic light emitting display system according to an embodiment of the present invention, the protection film covers front and lateral surfaces of any one of the substrates to which light of the organic light emitting diode layer is emitted and transmitted, of the two substrates.

In the rollable organic light emitting display system according to an embodiment of the present invention, a lateral surface of any one substrate protected by the protection film protrudes less than a lateral surface of the remaining substrate.

In the rollable organic light emitting display system according to an embodiment of the present invention, the protection film has any one among a damage-preventing capability of 103 cm~118 cm for a ball having a weight of 10 g, a damage-preventing capability of 41 cm~50 cm for a ball having a weight of 28 g, and a damage-preventing capability of 27 cm~35 cm for a ball having a weight of 40 g.

A rollable organic light emitting display system according to an embodiment of the present invention comprising, a thin film transistor layer provided on a first substrate of two substrates, an organic light emitting diode layer on the thin film transistor layer, and an encapsulation layer for covering the organic light emitting diode layer. In the rollable organic light emitting display system according to an embodiment of the present invention, the second substrate of the two substrates is provided on the encapsulation layer and the protection film is attached to a lateral surface of the first substrate.

In the rollable organic light emitting display system according to an embodiment of the present invention, the protection film includes a first protecting portion attached to a lower surface of the first substrate and a second protecting portion extending from one end of the first protecting portion along the lateral surface of the first substrate.

In the rollable organic light emitting display system according to an embodiment of the present invention, the second protecting portion is in contact with a lateral surface of the second substrate.

In the rollable organic light emitting display system according to an embodiment of the present invention, the second protecting portion extending from the lateral surface of the first substrate is in contact with a lateral surface of the encapsulation layer.

In the rollable organic light emitting display system according to an embodiment of the present invention, the second substrates protrudes more than the first substrate.

In the rollable organic light emitting display system according to an embodiment of the present invention, the second protecting portion extending from the lateral surface of the first substrate is in contact with a lower surface of the second substrate which protrudes more than the first substrate.

In the rollable organic light emitting display system according to an embodiment of the present invention, the protection film further includes a third protecting portion extending from one end of the second protecting portion along a lower surface of the second substrate which protrudes more than the first substrate.

In the rollable organic light emitting display system according to an embodiment of the present invention, the second protecting portion extending from the lateral surface of the first substrate is in contact with the lateral surface of the second substrate.

In the rollable organic light emitting display system according to an embodiment of the present invention, the protection film has any one among a damage-preventing capability of 103 cm~118 cm for a ball having a weight of 10 g, a damage-preventing capability of 41 cm~50 cm for a ball having a weight of 28 g, and a damage-preventing capability of 27 cm~35 cm for a ball having a weight of 40 g.

In the rollable organic light emitting display system according to an embodiment of the present invention, the first and second substrates are capable of being rolled onto the roller or unrolled from the roller, and the protection film is attached to the lateral surface of the first substrate which is not parallel to a lengthwise direction of the roller.

In the rollable organic light emitting display system according to an embodiment of the present invention, a gate driving integrated circuit is provided at a lateral side of the first substrate to which the protection film is attached.

In the rollable organic light emitting display system according to an embodiment of the present invention, the encapsulation layer covers the gate driving integrated circuit.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to embodiments of the present invention will be described in detail with reference to the accompanying drawings.

Figure 2A:
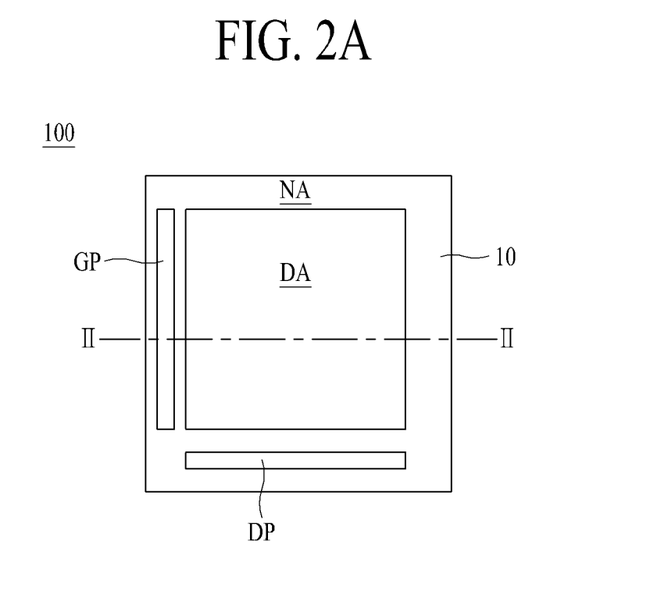
FIG. 2A is a plane view illustrating an organic light emitting display device according to one embodiment of the present invention.
Figure 2B:
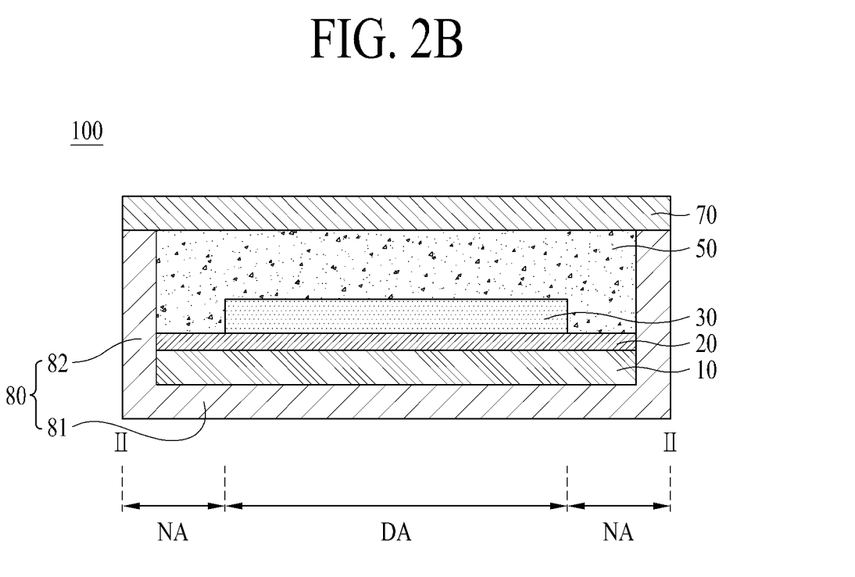
FIG. 2B is a cross sectional view illustrating the organic light emitting display device according to one embodiment of the present invention, which is cross sectional view along II-II of FIG. 2A.

FIG. 2A is a plane view illustrating an organic light emitting display device according to one embodiment of the present invention. FIG. 2B is a cross sectional view illustrating the organic light emitting display device according to one embodiment of the present invention, which is cross sectional view along II-II of FIG. 2A.

In the organic light emitting display device 100 according to one embodiment of the present invention, as shown in FIG. 2A, a display area (DA) is dispose on a substrate 10, and a non-display area (NA) is disposed in the periphery of the display area (DA). Herein, a gate pad (GP) and a data pad (DP) are provided in the non-display area (NA). For example, the gate pad (GP) may be disposed at a left side of the display area (DA), and the data pad (DP) may be disposed at a lower side of the display area (DA).

As shown in FIG. 2B, the organic light emitting display device 100 according to one embodiment of the present invention may include two substrates 10 and 70 which may be rolled or unrolled, and an organic light emitting diode layer 30 disposed between the two substrates 10 and 70. In addition, the organic light emitting display device 100 according to one embodiment of the present invention may include a protection film 80 covering a lateral side of at least one of the substrates 10 and 70, wherein the protection film 80 prevents the lateral side of at least one of the substrates 10 and 70 from being damaged by an external impact when the lateral side of each of the two substrates 10 and 70 being unrolled is exposed to the external. In more detail, the organic light emitting display device 100 according to one embodiment of the present invention may include the substrate 10, a thin film transistor layer 20, the organic light emitting diode layer 30, an encapsulation layer 50, the encapsulation substrate 70 and the protection film 80.

In the display area (DA) of the substrate 10, there are the thin film transistor layer 20, the organic light emitting diode layer 30, the encapsulation layer 50 and the encapsulation substrate 70 which are sequentially stacked thereon. The thin film transistor layer 20, the encapsulation layer 50 and the encapsulation substrate 70 extend to the non-display area (NA) of the substrate 10.

The substrate 10 may be formed of glass. If a thickness of the glass is minimized, the glass may be bent. Thus, it is possible to realize a rollable organic light emitting display device by adjusting a thickness of the glass.

The thin film transistor layer 20 is formed on an upper surface of the substrate 10.

The thin film transistor layer 20 may include various lines such as gate, data and power lines provided by each pixel, and a switching thin film transistor and a driving thin film transistor connected with the above lines. A detailed structure of each of the lines and the switching or driving thin film transistor may be changed to various structures generally known to those in the art.

The thin film transistor layer 20 is formed in the display area (DA), and also formed in the non-display area (NA) in the periphery of the display area (DA). The aforementioned various lines and the switching or driving thin film transistor are formed in the display area (DA), and a gate pad (GP) for connecting the various lines to an external driver is formed in the non-display area (NA).

The organic light emitting diode layer 30 is formed on the thin film transistor layer 20. Especially, the organic light emitting diode layer 30 is formed in the display area (DA).

Although not shown in detail, the organic light emitting diode layer 30 may include an anode, a hole injecting layer, a hole transporting layer, an emitting layer, an electron transporting layer, an electron injecting layer and a cathode, which are provided by each pixel. The organic light emitting diode layer 30 may be manufactured in various methods generally known to those in the art.

The encapsulation layer 50 is formed on the organic light emitting diode layer 30. The encapsulation layer 50 covers upper and lateral surfaces of the organic light emitting diode layer 30 so that it is possible to prevent moisture and oxygen from being permeated into the inside of the organic light emitting diode layer 30. The encapsulation layer 50 may be formed of resin. Also, the encapsulation layer 50 may further include a structure of repetitively stacking an organic layer and an inorganic layer on the organic light emitting diode layer 30. However, it is not limited to this structure. That is, the encapsulation layer 50 may be formed in various structures generally known to those in the art.

The encapsulation substrate 70 is formed on the encapsulation layer 50. The substrate 10 and the encapsulation substrate 70 are bonded to each other by the use of encapsulation layer 50.

The encapsulation substrate 70 together with the encapsulation layer 50 prevents external moisture and oxygen from being permeated into the inside of the organic light emitting diode layer 30. The encapsulation substrate 70 may be formed of an opaque material such as metal, but not limited to this material. The encapsulation substrate 70 may be formed of various materials generally known to those in the art, for example, glass, plastic, and etc.

The protection film 80 protects the organic light emitting display device 100 from an external impact. Especially, the protection film 80 prevents each lateral side of the organic light emitting display device 100 from being damaged by an external impact. The protection film 80 according to one embodiment of the present invention covers front and lateral surfaces of the substrate 10 provided with the organic light emitting diode layer 30. To this end, the protection film 80 according to one embodiment of the present invention may include a first protecting portion 81 and a second protecting portion 82.

The first protecting portion 81 is attached to a lower surface of the substrate 10, and the second protecting portion 82 extends from one end of the first protecting portion 81 along the lateral surface of the substrate 10. Accordingly, the lower surface of the substrate 10 may be protected by the first protecting portion 81 being in contact with the lower surface of the substrate 10, and the lateral surface of the substrate 10 may be protected by the second protecting portion 82 being in contact with the lateral surface of the substrate 10.

Referring to FIG. 2B, the second protecting portion 82 extends from the lateral surface of the substrate 10 to the lower surface of the encapsulation substrate 70 through the lateral surface of the encapsulation layer 50. The encapsulation substrate 70 protrudes more than the substrate 10 by a thickness of the second protecting portion 82 so that one end of the second protecting portion 82 is brought into contact with the lower surface of the encapsulation substrate 70.

According to one embodiment of the present invention, the protecting film 80 extends from the lower surface of the substrate 10 to the lower surface of the encapsulation substrate 70. Thus, it is possible to protect the lower surface of the substrate 10 and the lateral surface of the substrate 10 when an external impact is applied to the organic light emitting display device 100.

Meanwhile, the encapsulation layer 50 is provided on the thin film transistor layer 20, wherein a length of the encapsulation layer 50 is the same as a length of the substrate 10, whereby the encapsulation layer 50 may be in contact with the second protecting portion 82 of the protection film 80. That is, referring to FIGS. 2A and 2B, the thin film transistor layer 20 includes the gate pad (GP) provided in the non-display area (NA), the encapsulation layer 50 is formed on the gate pad (G), and the protection film 80 may be in contact with the thin film transistor layer 20 and the encapsulation layer 50. In this structure, it is favorable that a gate driving integrated circuit is formed in the gate pad (GP), that is, gate-driver in panel (GIP). In more detail, if a flexible printed circuit film provided with a gate driving chip therein is attached to the gate pad (GP), that is, chip on film (COF), the flexible printed circuit film is formed along the lateral surface of the substrate 10, whereby it is difficult to form the protection film 80 along the lateral surface of the substrate 10. Meanwhile, if the gate driving integrated circuit is formed in the gate pad (GP), there is no need for an additional flexible printed circuit film for connection with an external driver, whereby it facilitates to form the protection film 80 along the lateral surface of the substrate 10.

In the drawings, a length of the thin film transistor layer 20 is the same as the length of the encapsulation layer 50, whereby the thin film transistor layer 20 is in contact with the second protecting portion 82, but not necessarily. The encapsulation layer 50 may be provided to cover the thin film transistor layer 20 so that only the lateral surface of the encapsulation layer 50 may be in contact with the second protecting portion 82.

Also, the protection film 80, and more particularly, the second protecting portion 82 is provided to cover the lateral surface of the encapsulation layer 50 while being in contact with the lateral surface of the encapsulation layer 50 so that it is possible to protect the organic light emitting diode layer 30 by preventing external moisture and oxygen from being permeated through the lateral surface of the encapsulation layer 50.

When the organic light emitting display device 100 according to the present invention is applied to a bottom emission type, light is emitted in a direction of the substrate 10. Preferably, a polarizing film is attached to the lower surface of the substrate 10 so as to reduce a reflection by an external light. In this case, the protection film 80 may be formed of the polarizing film. Thus, the protection film 80 prevents the substrate 10 from being damaged, and also prevents the reflection of the external light.

Meanwhile, if the protection film 80 is not formed of the polarizing film, the polarizing film may be additionally formed between the protection film 80 and the substrate 10, or may be additionally formed on a lower surface of the protection film 80.

The protection film 80 may be attached to the lower surface of the substrate 10 by the use of additional adhesive, may be coated onto the lower surface of the substrate 10 in a liquid coating method, or may be deposited onto the lower surface of the substrate 10 in a chemical vapor deposition (CVD) such as sputtering.

According to one embodiment of the present invention, the protection film 80 extends from the lower surface of the substrate 10 so as to cover a protruding lower side of the encapsulation substrate 70, to thereby absorb an external impact. That is, the protection film 80 is formed in a structure of absorbing an external impact, and dispersing the absorbed impact to the encapsulation substrate 70. Accordingly, when the external impact is applied, the lower surface of the substrate 10 and the lateral surface of the substrate 10 may be protected by the protection film 80, to thereby reduce a damage of the substrate 10. Also, the protection film 80 prevents moisture and oxygen from being permeated through the lateral surface of the encapsulation layer 50, thereby enhancing an encapsulation efficiency at the lateral surface of the organic light emitting display device 100.

Figure 3:
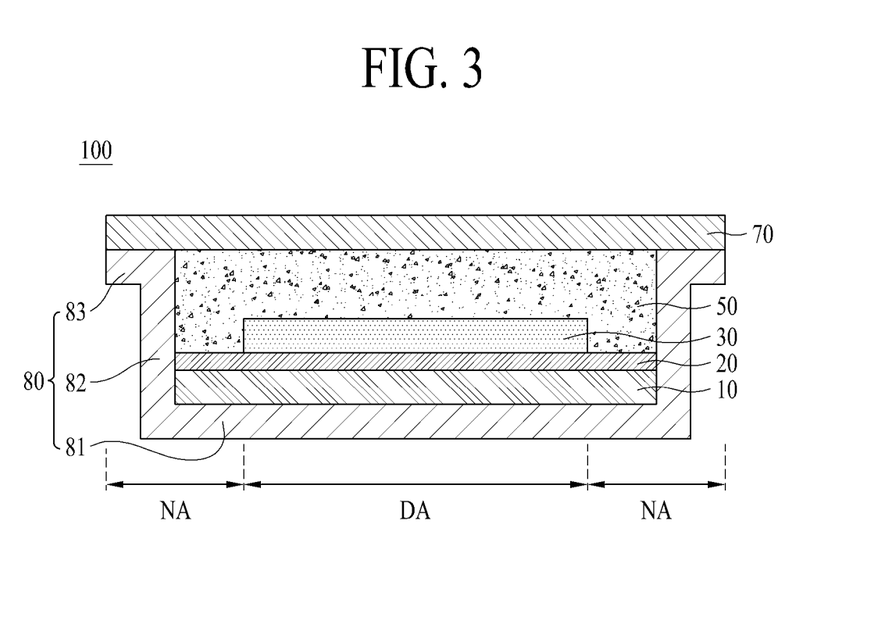
FIG. 3 is a cross sectional view illustrating an organic light emitting display device according to another embodiment of the present invention, which is a cross sectional view along II-II of FIG. 2A.

FIG. 3 is a cross sectional view illustrating an organic light emitting display device according to another embodiment of the present invention, which is a cross sectional view along II-II of FIG. 2A.

As shown in FIG. 3, in the same manner as the aforementioned organic light emitting display device shown in FIG. 2B, the organic light emitting display device 100 according to another embodiment of the present invention may include a substrate 10, a thin film transistor layer 20, an organic light emitting diode layer 30, an encapsulation layer 50, an encapsulation substrate 70 and a protection film 80.

Referring to FIG. 3, the encapsulation substrate 70 protrudes more than the substrate 10, wherein a protruding portion of the encapsulation substrate 70 is larger than a thickness of a second protection portion 82, and the protection film 80 further includes a third protecting portion 83 which extends from one end of the second protecting portion 82 along a protruding lower surface of the encapsulation substrate 70. Except for this structure, the organic light emitting display device of FIG. 3 is the same as the aforementioned organic light emitting display device of FIG. 2B, whereby a detailed description for the same parts will be omitted.

The encapsulation substrate 70 protrudes more than the second protecting portion 82 attached to a lateral surface of the substrate 10, wherein the protruding portion of the encapsulation substrate 70 is larger than the thickness of the second protecting portion 82. Accordingly, the third protecting portion 83, which extends from one end of the second protecting portion 82 along the lower surface of the encapsulation substrate 70, is in contact with the lower surface of the encapsulation substrate 70.

According to another embodiment of the present invention, the protection film 80 extends from the lower surface of the substrate 10 to the protruding lower surface of the encapsulation substrate 70 so that it is possible to protect the lower and lateral surfaces of the substrate 10 from the externally impact. Also, a contact area between the third protecting portion 83 and the encapsulation substrate 70 is increased so that the external impact is absorbed by the protection film 80 and the absorbed impact is dispersed to the encapsulation substrate 70 with the protection film 80 attached thereto, to thereby improve an impact-absorbing efficiency. In addition, the protection film 80 covers the lateral surface of the encapsulation layer 50 so that it is possible to reduce moisture and oxygen being permeated into the inside of the organic light emitting diode layer 30 through the lateral surface of the encapsulation layer 50. According as a length of the interface between the encapsulation substrate 70 and the protection film 80 extends by a length of the third protecting portion 83, it is possible to delay a permeation time of moisture or oxygen through the interface between the encapsulation substrate 70 and the protection film 80, to thereby enhance an encapsulation efficiency of the encapsulation layer 50.

Figure 4:
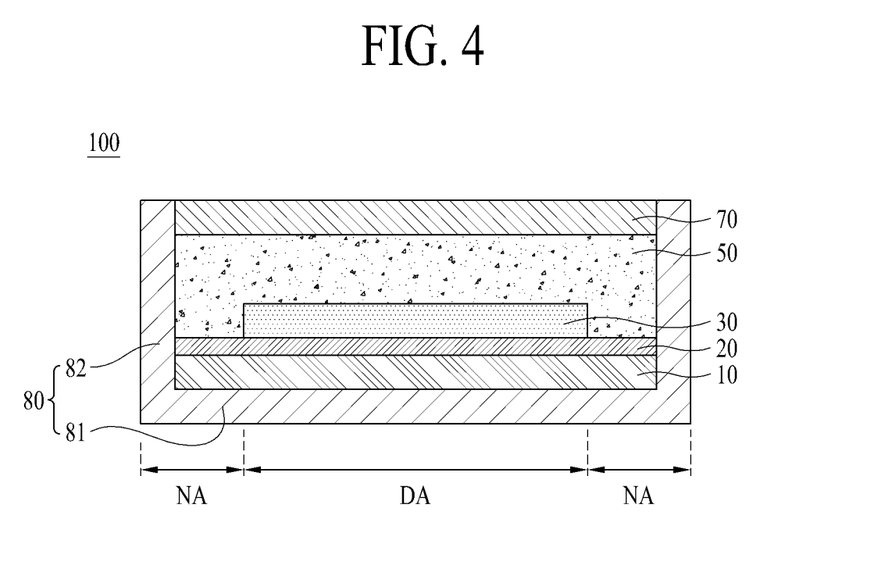
FIG. 4 is a cross sectional view illustrating an organic light emitting display device according to another embodiment of the present invention, which is a cross sectional view along II-II of FIG. 2A.

FIG. 4 is a cross sectional view illustrating an organic light emitting display device according to another embodiment of the present invention, which is a cross sectional view along II-II of FIG. 2A.

As shown in FIG. 4, in the same manner as the aforementioned organic light emitting display device shown in FIG. 2B, the organic light emitting display device 100 according to another embodiment of the present invention may include a substrate 10, a thin film transistor layer 20, an organic light emitting diode layer 30, an encapsulation layer 50, an encapsulation substrate 70 and a protection film 80.

Referring to FIG. 4, a length of the encapsulation substrate 70 is the same as a length of the substrate 10, and a second protecting portion 82 of the protection film 80 extends from a lateral surface of the substrate 10 to a lateral surface of the encapsulation substrate 70 so that one end of the second protecting portion 82 is in contact with the lateral surface of the encapsulation substrate 70. Except for this structure, the organic light emitting display device of FIG. 4 is the same as the aforementioned organic light emitting display device of FIG. 2B, whereby a detailed description for the same parts will be omitted.

According to another embodiment of the present invention, the length of the substrate 10 is the same as the length of the encapsulation substrate 70, whereby the second protecting portion 82 is formed in a straight line shape while being in contact with the lateral surface of the substrate 10 and the lateral surface of the encapsulation substrate 70. Accordingly, when an external impact is applied, the lateral surface of the encapsulation substrate 70 as well as the lower surface of the substrate 10 and the lateral surface of the substrate 10 may be protected by the protection film 80. That is, if the encapsulation substrate 70 is formed of glass which is easily damaged by an external impact, the embodiment of FIG. 4 is preferable to the embodiments of FIG. 2B and FIG. 3.

Also, the second protecting portion 82 covers the lateral surface of the encapsulation substrate 70 and the lateral surface of the encapsulation layer 50 so that it is possible to reduce moisture and oxygen being permeated through the interface between the encapsulation substrate 70 and the encapsulation layer 50.

Hereinafter, stiffness test results of the organic light emitting display device 100 according to whether the protection film 80 is provided or not will be shown.

Figure 5:
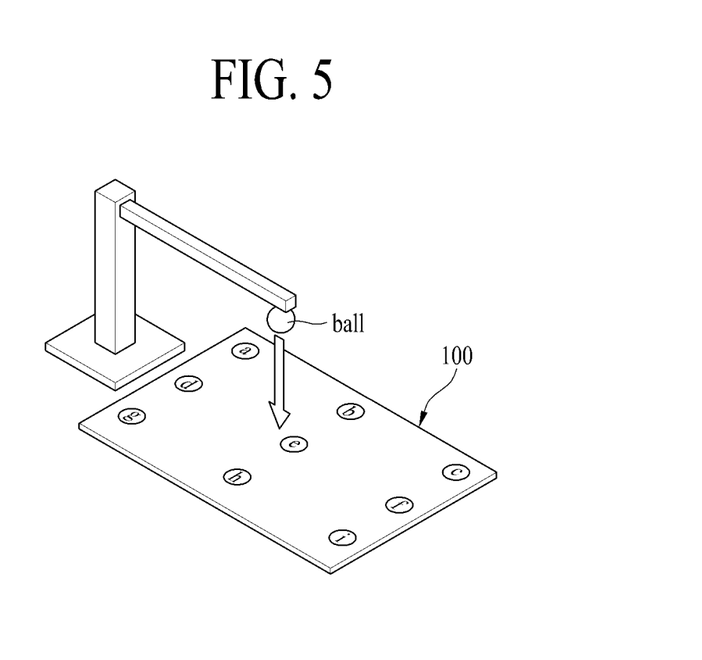
FIG. 5 illustrates a stiffness test of the organic light emitting display device.

FIG. 5 illustrates an exemplary stiffness test of the organic light emitting display device. Referring to FIG. 5, a stiffness test is carried out by dropping a ball on the organic light emitting display device 100, wherein a drop height of the ball is changed, and measuring a height at which the organic light emitting display device 100 is damaged by an impact of the dropping ball. In more detail, when the aforementioned protection film 80 is not provided, the ball is dropped to the surface of the substrate 10, wherein the drop height of the ball is changed, and then a height at which the substrate 10 is damaged by the ball is measured. Also, when the aforementioned protection film 80 is provided, the ball is dropped to the surface of the substrate 10, wherein the drop height of the ball is changed, and then the height at which the substrate 10 is damaged by the ball is measured. Herein, nine locations (ⓐ~ⓘ)), onto which the ball is to be dropped, are selected on the organic light emitting display device 100, and then a height at which the organic light emitting display device 100 is damaged is also measured in accordance with the location. The results (measurement unit: cm) are shown in the following Table 1.

the ball is about 41 cm~50 cm, and an average value is about 45 cm. This shows that a damage-preventing capability of the organic light emitting display device 100 having the protection film 80 in accordance with the external impact is enhanced.

Then, in a case of dropping the ball having a weight of 40 g, and not being provided with the protection film 80, when the above points (ⓐ~ⓘ) of the organic light emitting display device 100 are damaged, a drop height value of the ball is about 22 cm~25 cm, and an average value is about 23 cm. Meanwhile, in case of dropping the ball having a weight of 40 g, and being provided with the protection film 80, when the above points (ⓐ~ⓘ) of the organic light emitting display device 100 are damaged, a drop height value of the ball is about 27 cm~35 cm, and an average value is about

TABLE 1

| location classification | | ⓐ | ⓑ | ⓒ | ⓓ | ⓔ | ⓕ | ⓖ | ⓗ | ⓘ | average |
|---|---|---|---|---|---|---|---|---|---|---|---|
| 10 g | No protection film | 72 | 70 | 67 | 68 | 71 | 72 | 69 | 72 | 65 | 70 |
|  | Provided with protection film | 112 | 115 | 104 | 103 | 118 | 108 | 112 | 112 | 112 | 111 |
| 28 g | No protection film | 35 | 35 | 35 | 60 | 40 | 30 | 60 | 30 | 27 | 39 |
|  | Provided with protection film | 42 | 41 | 44 | 42 | 49 | 44 | 47 | 50 | 44 | 45 |
| 40 g | No protection film | 22 | 22 | 22 | 25 | 25 | 22 | 24 | 22 | 22 | 23 |
|  | Provided with protection film | 31 | 34 | 35 | 30 | 30 | 31 | 27 | 30 | 29 | 31 |

Based on the above data results, as a drop height of the ball becomes higher in the damaged location, a stiffness of the organic light emitting display device 100 becomes greater.

In more detail, in case of dropping the ball having a weight of 10 g, and not being provided with the protection film 80, when the above points (ⓐ~ⓘ) of the organic light emitting display device 100 are damaged, a drop height value of the ball is about 65 cm~72 cm, and an average value is about 70 cm. Meanwhile, in case of dropping the ball having a weight of 10 g, and being provided with the protection film 80, when the above points (ⓐ~ⓘ) of the organic light emitting display device 100 are damaged, a drop height value of the ball is about 103 cm~118 cm, and an average value is about 111 cm. This shows that a damage-preventing capability of the organic light emitting display device 100 having the protection film 80 in accordance with the external impact is enhanced.

Then, in case of dropping the ball having a weight of 28 g, and not being provided with the protection film 80, when the above points (ⓐ~ⓘ) of the organic light emitting display device 100 are damaged, a drop height value of the ball is about 27 cm~60 cm, and an average value is about 39 cm. Meanwhile, in case of dropping the ball having a weight of 28 g, and being provided with the protection film 80, when the above points (ⓐ~ⓘ) of the organic light emitting display device 100 are damaged, a drop height value of 31 cm. This shows that a damage-preventing capability of the organic light emitting display device 100 having the protection film 80 in accordance with the external impact is enhanced.

As a result, as shown in the above Table 1, in a case of each of the balls having a weight of 10 g, 28 g and 40 g, when the protection film 80 is provided, a damage-preventing capability of the organic light emitting display device 100 in accordance with the external impact is enhanced.

Accordingly, it is possible to derive requirements of the protection film 80 appropriate for enhancing the damage-preventing capability from the above experimental results. That is, the protection film 80 has the damage-preventing capability of 103 cm~118 cm for the ball having a weight of 10 g, the damage-preventing capability of 41 cm~50 cm for the ball having a weight of 28 g, and the damage-preventing capability of 27 cm~35 cm for the ball having a weight of 40 g, preferably.

If the damage-preventing capability of the protection film 80 is higher than 118 cm for the ball having a weight of 10 g, 50 cm for the ball having a weight of 28 g, or 35 cm for the ball having a weight of 40 g, the damage-preventing capacity is great, however, flexibility is lowered, whereby it is not appropriate for a rollable organic light emitting display device.

Figure 6:
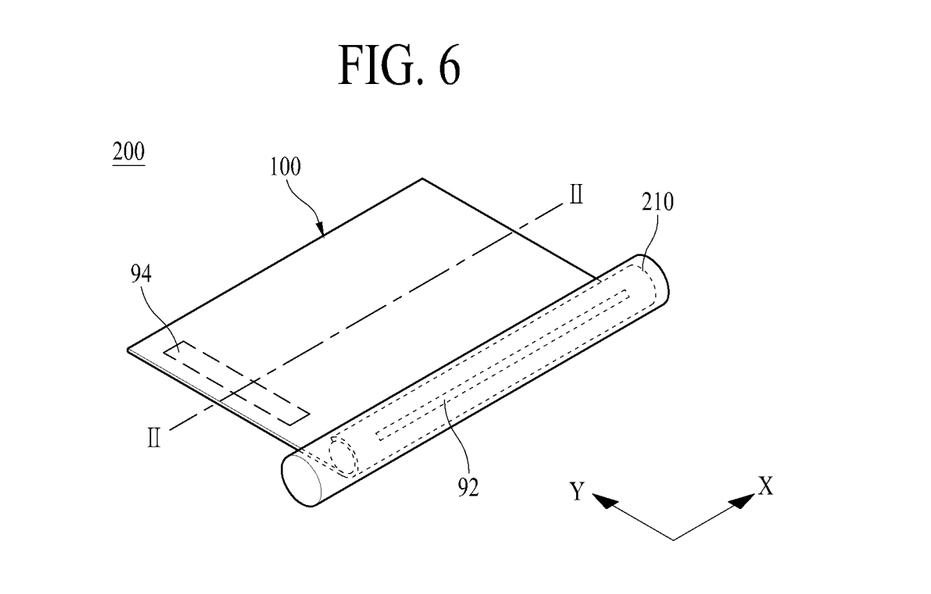
FIG. 6 roughly illustrates a rollable organic light emitting display system according to one embodiment of the present invention.

FIG. 6 roughly illustrates a rollable organic light emitting display system having the organic light emitting display device according to one embodiment of the present invention.

The rollable organic light emitting display system 200 according to one embodiment of the present invention may include a roller 210, and the organic light emitting display device 100 capable of being rolled on the roller 210.

The organic light emitting display device 100 corresponds to the organic light emitting display device according to the embodiments of the present invention shown in FIGS. 2B to 4, whereby a detailed description for the organic light emitting display device 100 will be omitted.

The organic light emitting display device 100 according to the various embodiments of the present invention shown in FIGS. 2B to 4 correspond to a cross section along II-II of FIG. 6. Accordingly, the aforementioned protection film 80 is formed at the lateral side of the organic light emitting display device which is not parallel to a lengthwise direction (X-direction) of the roller 210.

The roller 210 is driven by an additional driving apparatus, wherein the roller 210 is prepared to roll or unroll the organic light emitting display device 100. Thus, if a user does not watch an image, the organic light emitting display device 100 is maintained while being rolled on the roller 210. If a user wants to watch an image, the organic light emitting display device 100 is unrolled by the roller 210.

For organizing the rollable organic light emitting display system 200, there is a need for appropriately adjusting a position of an external circuit driver provided in the organic light emitting display device 100. For watching an image, if the organic light emitting display device 100 stands, a lower side of the organic light emitting display device 100 is maintained while being rolled on the roller 210, however, a lateral side of the organic light emitting display device 100 is unrolled from the roller 210. In this respect, an external circuit driver such as flexible printed circuit film is provided in the lower side of the organic light emitting display device 100 instead of the lateral side of the organic light emitting display device 100, preferably.

As shown in the drawings, a data pad 92 is provided in a lower non-display area of the organic light emitting display device 100, and also arranged in the lengthwise direction (X-direction) of the roller 210, preferably. Also, if a gate driver is provided in a lateral non-display area of the organic light emitting display device 100, it is preferable to form a gate driving integrated circuit (GIP) 94, that is, gate-driver in panel (GIP), in which a circuit is directly provided in the substrate.

According to the present invention, it is possible to protect the lateral side of the organic light emitting display device 100 from an external impact, and to reduce the damage on the organic light emitting display device 100.

Also, the lateral side of the organic light emitting display device 100 is covered by the protection film 80, thereby enhancing the encapsulation efficiency at the lateral side of the organic light emitting display device 100.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A rollable organic light emitting display system with an organic light emitting diode layer between two substrates, wherein the two substrates are capable of being rolled or unrolled, the system comprising:
   a thin film transistor layer provided on a first substrate of the two substrates,
   an organic light emitting diode layer provided on the thin film transistor layer; and
   a protection film covering a lateral surface of at least one of the substrates so as to prevent the lateral surface of the at least one substrate from being damaged by an external impact when the two substrates are unrolled and the lateral surface of the two substrates is exposed to the external impact,
   wherein the protection film includes:
   a first protecting portion attached to a lower surface of the first substrate; and
   a second protecting portion extending from one end of the first protecting portion along the lateral surface of the first substrate.

2. The rollable organic light emitting display system according to claim 1, wherein the protection film covers front and lateral surfaces of any one substrate having the organic light emitting diode layer of the two substrates.

3. The rollable organic light emitting display system according to claim 1, wherein the protection film covers front and lateral surfaces of any one substrate, to which light of the organic light emitting diode layer is emitted and transmitted, of the two substrates.

4. The rollable organic light emitting display system according to claim 3, wherein a lateral surface of any one substrate protected by the protection film protrudes less than a lateral surface of the remaining substrate.

5. The rollable organic light emitting display system according to claim 4, wherein the protection film has any one among a damage-preventing capability of 103 cm~118 cm for a ball having a weight of 10 g, a damage-preventing capability of 41 cm~50 cm for a ball having a weight of 28 g, and a damage-preventing capability of 27 cm~35 cm for a ball having a weight of 40 g.

6. The rollable organic light emitting display system according to claim 1, further comprising:
   an encapsulation layer covering the organic light emitting diode layer,
   wherein a second substrate of the two substrates is provided on the encapsulation layer, and the protection film is attached to a lateral surface of the first substrate.

7. The rollable organic light emitting display system according to claim 6, wherein the second protecting portion contacts a lateral surface of the second substrate.

8. The rollable organic light emitting display system according to claim 7, wherein the second protecting portion extending from the lateral surface of the first substrate contacts a lateral surface of the encapsulation layer.

9. The rollable organic light emitting display system according to claim 7, wherein the second substrates protrudes more than the first substrate.

10. The rollable organic light emitting display system according to claim 9, wherein the second protecting portion extending from the lateral surface of the first substrate contacts a lower surface of the second substrate which protrudes more than the first substrate.

11. The rollable organic light emitting display system according to claim 9, wherein the protection film further includes a third protecting portion extending from one end of the second protecting portion along a lower surface of the second substrate which protrudes more than the first substrate.

12. The rollable organic light emitting display system according to claim 8, wherein the second protecting portion extending from the lateral surface of the first substrate contacts the lateral surface of the second substrate.

13. The rollable organic light emitting display system according to claim 6, wherein the protection film has any one among a damage-preventing capability of 103 cm~118 cm for a ball having a weight of 10 g, a damage-preventing capability of 41 cm~50 cm for a ball having a weight of 28 g, and a damage-preventing capability of 27 cm~35 cm for a ball having a weight of 40 g.

14. The rollable organic light emitting display system according to claim 6,
   wherein the first and second substrates are capable of being rolled onto a roller or unrolled from the roller, and
   the protection film is attached to the lateral surface of the first substrate which is not parallel to a lengthwise direction of the roller.

15. The rollable organic light emitting display system according to claim 14, wherein a gate driving integrated circuit is provided at a lateral side of the first substrate to which the protection film is attached.

16. The rollable organic light emitting display system according to claim 15, wherein the encapsulation layer covers the gate driving integrated circuit.

* * * * *